(12) United States Patent
Lee et al.

(10) Patent No.: US 10,886,415 B2
(45) Date of Patent: Jan. 5, 2021

(54) MULTI-STATE TRANSISTOR DEVICES WITH MULTIPLE THRESHOLD VOLTAGE CHANNELS

(71) Applicant: INTERNATIONAL BUSINESS MACHINES CORPORATION, Armonk, NY (US)

(72) Inventors: Ko-Tao Lee, Yorktown Heights, NY (US); Pierce I-Jen Chuang, Briarcliff Manor, NY (US); Cheng-Wei Cheng, White Plains, NY (US); Seyoung Kim, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/295,750

(22) Filed: Mar. 7, 2019

(65) Prior Publication Data
US 2020/0287055 A1    Sep. 10, 2020

(51) Int. Cl.
*H01L 29/786*  (2006.01)
*H01L 29/66*  (2006.01)
(Continued)

(52) U.S. Cl.
CPC .. *H01L 29/78696* (2013.01); *H01L 29/42392* (2013.01); *H01L 29/6653* (2013.01);
(Continued)

(58) Field of Classification Search
None
See application file for complete search history.

(56) References Cited

U.S. PATENT DOCUMENTS 3,283,176 A    11/1966   Gilliland et al.
5,687,355 A    11/1997   Joardar et al.
(Continued)

OTHER PUBLICATIONS

Kim et al., "A Novel Multi-channel Field Effect Transistor (McFET) on Bulk Si for High Peformance Sub-80nm Application", IEDM Technical Digest. IEEE International Education Devices Meeting. Dec. 13, 2004. pp. 639-642.
(Continued)

*Primary Examiner* — Ashok Patel
(74) *Attorney, Agent, or Firm* — Tulunjian & Biletto, P.C.; Joseph Petrokaitis

(57) ABSTRACT

A method of forming a multi-state nanosheet transistor device is provided. The method includes forming an alternating sequence of sacrificial layer segments and differentially doped nanosheet layer segments on a substrate, wherein each of the differentially doped nanosheet layer segments has a different dopant concentration from the other differentially doped nanosheet layer segments. The method further includes forming a source/drain on each of opposite ends of the sacrificial layer segments and differentially doped nanosheet layer segments, and removing the sacrificial layer segments. The method further includes depositing a gate dielectric layer on the differentially doped nanosheet layer segments, and forming a gate electrode on the gate dielectric layer to form a common gate-all-around structure, where each of the differentially doped nanosheet layer segments conducts current at a different threshold voltage.

7 Claims, 6 Drawing Sheets

(51) Int. Cl.
  *H01L 29/78* (2006.01)
  *H01L 29/423* (2006.01)
  *H01L 29/10* (2006.01)
  *H01L 29/06* (2006.01)

(52) U.S. Cl.
  CPC .... *H01L 29/6681* (2013.01); *H01L 29/66553* (2013.01); *H01L 29/66742* (2013.01); *H01L 29/7853* (2013.01); *H01L 29/78642* (2013.01); *H01L 29/0673* (2013.01); *H01L 29/1033* (2013.01)

(56) References Cited

U.S. PATENT DOCUMENTS

| | | | |
|---|---|---|---|
| 7,211,845 B1 | 5/2007 | Yu et al. | |
| 7,276,723 B2 | 10/2007 | Fathimulla et al. | |
| 7,544,572 B2 | 6/2009 | Pan et al. | |
| 7,615,429 B2 | 11/2009 | Kim et al. | |
| 8,742,511 B2* | 6/2014 | Chang | H01L 29/42392 257/368 |
| 9,929,245 B2 | 3/2018 | Colinge et al. | |
| 2006/0240622 A1* | 10/2006 | Lee | H01L 29/78645 438/257 |
| 2011/0012085 A1* | 1/2011 | Deligianni | H01L 29/0676 257/9 |
| 2012/0319178 A1* | 12/2012 | Chang | H01L 29/78696 257/287 |

OTHER PUBLICATIONS

Ragnarsson et al., "Highly Scalable Bulk FinFET Devices with Multi-VT Options by Conductive Metal Gate Stack Tuning for the 10-nm Node and Beyond", 2014 Symposium on FLSI Technology Digest of Technical Papers. Jul. 9, 2014. pp. 1-2.

* cited by examiner

MULTI-STATE TRANSISTOR DEVICES WITH MULTIPLE THRESHOLD VOLTAGE CHANNELS

BACKGROUND

The present invention generally relates to field effect transistor (FET) devices, and more particularly to multi-state transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a multi-state nanosheet transistor device is provided. The method includes forming an alternating sequence of sacrificial layer segments and differentially doped nanosheet layer segments on a substrate, wherein each of the differentially doped nanosheet layer segments has a different dopant concentration from the other differentially doped nanosheet layer segments. The method further includes forming a source/drain on each of opposite ends of the sacrificial layer segments and differentially doped nanosheet layer segments, and removing the sacrificial layer segments. The method further includes depositing a gate dielectric layer on the differentially doped nanosheet layer segments, and forming a gate electrode on the gate dielectric layer to form a common gate-all-around structure, where each of the differentially doped nanosheet layer segments conducts current at a different threshold voltage.

In accordance with another embodiment of the present invention, a multi-state nanosheet transistor device is provided. The multi-state nanosheet transistor device includes at least two differentially doped nanosheet layer segments between two source/drains, wherein each of the differentially doped nanosheet layer segments has a different dopant concentration from the other differentially doped nanosheet layer segments. The device further includes a gate dielectric layer on each of the differentially doped nanosheet layer segments, and a gate electrode on the gate dielectric layer to form a common gate-all-around structure, where each of the differentially doped nanosheet layer segments conducts current at a different threshold voltage.

In accordance with yet another embodiment of the present invention, a multi-state fin field effect transistor device is provided. The multi-state fin field effect transistor device includes a bottom source/drain region on a substrate, and at least two differentially doped vertical fins on the bottom source/drain region, wherein each of the differentially doped vertical fins has a different dopant concentration from the other differentially doped vertical fins. The device further includes a top source drain on each of the at least two differentially doped vertical fins, where the top source drain is on the opposite end of the differentially doped vertical fins from the bottom source/drain region. The multi-state fin field effect transistor device further includes a gate dielectric layer on each of the differentially doped vertical fins, and a work function layer of the gate dielectric layer. The multi-state fin field effect transistor device further includes a gate fill layer on the work function layer to form a common gate structure on the at least two differentially doped vertical fins, where each of the differentially doped vertical fins conducts current at a different threshold voltage.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a multi-state transistor device with multiple threshold voltage device channels, where each of the device channels has a different dopant concentration than the other channels. The multiple device channels can be differentially doped to provide different threshold voltages at which current flows though the different channels, so a current behaving as a step function can flow through the device as each higher threshold voltage is triggered. The transistor device can thereby provide a number of steps dependent on the number of differently doped channels, unlike a logic transistor that only switches between "on" and "off" states.

Embodiments of the present invention provide a nanosheet transistor device, where each of the sheets of the nanosheet transistor device can be differentially doped to provide different threshold voltages. Each of two or more nanosheets can have a different threshold voltage based on the dopant concentrations.

Embodiments of the present invention provide a vertical transport fin field effect transistor (VT FinFET) device, where each of the vertical fins of the VT FinFET transistor device can be differentially doped to provide different threshold voltages. Each of two or more vertical fins can have a different threshold voltage based on the dopant concentrations. The two or more vertical fins can be formed with a common bottom source/drain region and a merged top source/drain.

Embodiments of the present invention provide a method of fabricating a nanosheet transistor device having multiple nanosheets with different dopant levels.

Embodiments of the present invention provide a method of fabricating a VT FinFET device having multiple vertical fins acting as device channels with different dopant levels.

Exemplary applications/uses to which the present invention can be applied include, but are not limited to: voltage-controlled current sources, physical unclonable function (PUF) devices, logic devices having multiple states for non-base-two (i.e., non-binary) operation, neural networks (e.g., nodes) having weighted output based on multiple states, and memory devices storing multiple bits through multiple states.

It is to be understood that aspects of the present invention will be described in terms of a given illustrative architecture; however, other architectures, structures, substrate materials and process features and steps can be varied within the scope of aspects of the present invention.

Figure 1:
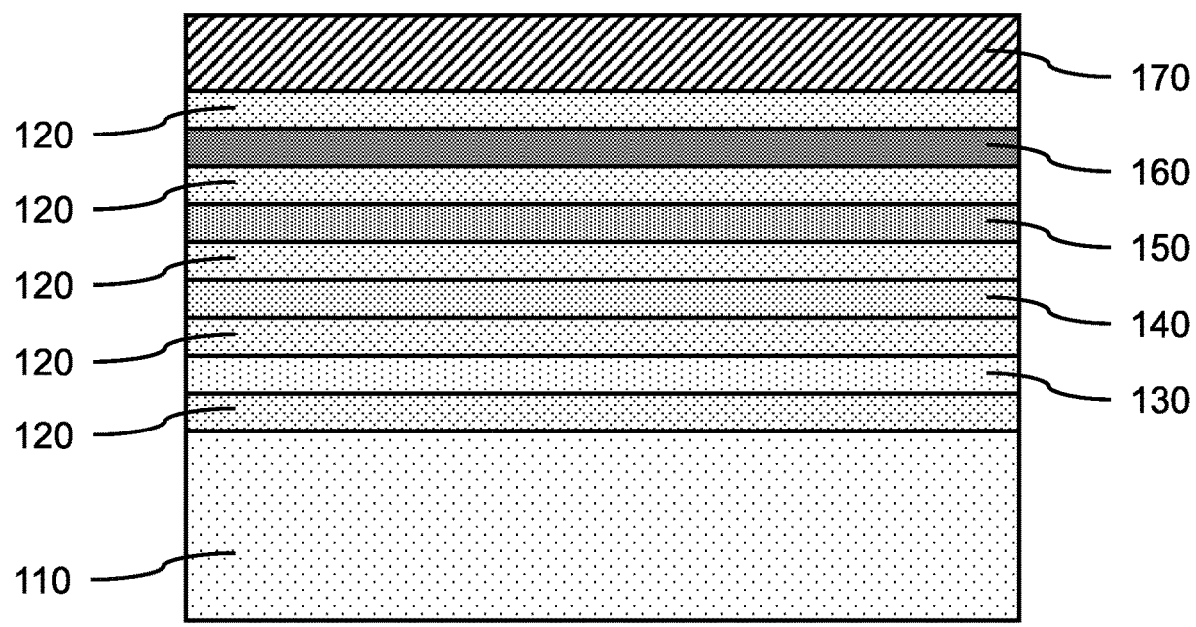
FIG. 1 is a cross-sectional side view showing a stack of alternating nanosheet layers and sacrificial layers on a substrate with a template layer on the stack, in accordance with an embodiment of the present invention.

Referring now to the drawings in which like numerals represent the same or similar elements and initially to FIG. 1, a cross-sectional side view of a stack of alternating nanosheet layers and sacrificial layers on a substrate with a template layer on the stack is shown, in accordance with an embodiment of the present invention.

In one or more embodiments, an alternating sequence of sacrificial layers 120 and nanosheet layers 130, 140, 150, 160 can be formed on a substrate 110, where the sacrificial layers 120 and nanosheet layers 130, 140, 150, 160 can be formed by epitaxial or heteroepitaxial growth on the surface of an underlying layer. In various embodiments, a first sacrificial layer 120 can be formed on the exposed surface of the substrate 110 by epitaxial or heteroepitaxial growth. A first nanosheet layer 130 can be formed on the exposed surface of the first sacrificial layer 120 by epitaxial or heteroepitaxial growth. A second sacrificial layer 120 can be formed on the exposed surface of the first nanosheet layer 130. A second nanosheet layer 140 having a different dopant concentration than the first nanosheet layer 130 can be formed on the second sacrificial layer. Another sacrificial layer 120 can be formed on the exposed surface of the second nanosheet layer 140, and a third nanosheet layer 150 having a different dopant concentration than the first and second nanosheet layers 130, 140 can be formed on the sacrificial layer. Similarly, a fourth nanosheet layer 160 having a different dopant concentration than the first, second, and third nanosheet layers 130, 140, 150 can be formed on another intervening sacrificial layer 120. Additional sacrificial layers 120 and nanosheet layers with different dopant concentrations can be formed. The repeated formation of layers can create an alternating arrangement of sacrificial layers 120 and nanosheet layers 130, 140, 150, 160. In various embodiments, the top layer can be a sacrificial layer 120, so there are is one more sacrificial layer 120 than nanosheet layers to provide access around each of the nanosheet layers.

In one or more embodiments, the sacrificial layers 120 are a semiconductor material that can be selectively removed from between nanosheet layers 130, while providing a surface that is conducive to epitaxial or heteroepitaxial growth. In various embodiments, the sacrificial layers 120 can be silicon germanium (SiGe), silicon-germanium carbide (SiGeC), III-V compound semiconductors (e.g., gallium arsenide (GaAs)), II-VI compound semiconductors (e.g., zinc telluride (ZnTe)), and combinations thereof, where the sacrificial layers 120 can be selectively removed from between the nanosheet layers 130 forming device channels. The nanosheet layers 130 can be a doped or undoped semiconductor material that can form a device channel for a nanosheet transistor device. In various embodiments, the nanosheet layers 130 can be silicon (Si), silicon carbide (SiC), III-V compound semiconductors (e.g., gallium arsenide (GaAs), indium-gallium-arsenide (InGaAs), gallium nitride (GaN), indium phosphide (InP), etc.), II-VI compound semiconductors (e.g., zinc telluride (ZnTe), etc.), and combinations thereof, such that the sacrificial layers 120 can be selectively removed from the nanosheet layers 130, 140, 150, 160 forming device channels.

In one or more embodiments, the sacrificial layers 120 can have a thickness in a range of about 4 nanometers (nm) to about 15 nm, or about 6 nm to about 12 nm, although other thicknesses are contemplated.

In one or more embodiments, the nanosheet layers 130, 140, 150, 160 can have a thickness in a range of about 3 nm to about 15 nm, or about 5 nm to about 8 nm, although other thicknesses are contemplated.

In various embodiments, the first nanosheet layer can have the lowest dopant concentration, and each successive nanosheet layer can have a greater dopant concentration, such that $C_{D1}<C_{D2}<C_{D3}<C_{D4}<C_{Dn}$, where the number represents the nanosheet layer. In various embodiments, the order of increasing dopant concentration can be reversed, so that the uppermost nanosheet has the least dopant concentration and the nanosheet closest to the substrate has the greatest dopant concentration. In various embodiments, the dopant concentrations can be randomly assigned, such that there is no pattern in the change in dopant concentration in the formation of the nanosheet layers.

While the exemplary description has discussed four nanosheets with different dopant concentration, this is not intended to be limiting, and other numbers of nanosheets are contemplated. In various embodiments, the number of nanosheets having different dopant concentrations can be in a range of 2 to 50, or in a range of 3 to 25, or in a range of 4 to 15, or in a range of 5 to 12, although other numbers are also contemplated. The number of nanosheets having different dopant concentrations can control the number of steps in the device/current step function.

In various embodiments, the dopant concentrations of the different nanosheet layers 130, 140, 150, 160 can provide different threshold voltages associated with each nanosheet layer, where for $C_{D1}<C_{D2}<C_{D3}<C_{D4}<C_{Dn}$; $V_{T1}<V_{T2}<V_{T3}<V_{T4}<V_{Tn}$, for example, for an n-type metal-oxide-semiconductor field effect transistor (MOSFET) device, where a lower dopant concentration can provide a lower threshold voltage. In various embodiments, a lower dopant concentration can provide a higher threshold voltage, where for $C_{D1}<C_{D2}<C_{D3}<C_{D4}<C_{Dn}$; $V_{T1}>V_{T2}>V_{T3}>V_{T4}>V_{Tn}$, for example, for a p-type metal-oxide-semiconductor field effect transistor (MOSFET) device In various embodiments, the differentially doped nanosheet layers 130, 140, 150, 160 can have a dopant concentration in a range of about $1\times10^{11}$ cm$^{-3}$ to about $1\times10^{19}$ cm$^{-3}$.

In various embodiments, a first nanosheet layer 130 can have a dopant concentration in a range of about $1\times10^{11}$ cm$^{-3}$ to about $1\times10^{19}$ cm$^{-3}$, or about $1\times10^{12}$ cm$^{-3}$ to about $1\times10^{18}$ cm$^{-3}$, or about $1\times10^{13}$ cm$^{-3}$ to about $1\times10^{17}$ cm$^{-3}$, although other concentrations are also contemplated.

In various embodiments, a second nanosheet layer 140 can have a dopant concentration in a range of about $2\times10^{11}$ cm$^{-3}$ to about $2\times10^{19}$ cm$^{-3}$, or about $2\times10^{12}$ cm$^{-3}$ to about $2\times10^{18}$ cm$^{-3}$, or about $2\times10^{13}$ cm$^{-3}$ to about $2\times10^{17}$ cm$^{-3}$, although other concentrations are also contemplated, where the dopant concentration of the second nanosheet layer 140 can have double the dopant concentration of the first nanosheet layer 130 to provide about a 150 mV difference in the threshold voltages between the first nanosheet layer 130 and the second nanosheet layer 140. In various embodiments, the differences in dopant concentrations between the nanosheet layers can be adjusted to obtain a predetermined change in the threshold voltages.

In various embodiments, a third nanosheet layer 150 can have a dopant concentration in a range of about $4\times10^{11}$ cm$^{-3}$ to about $4\times10^{19}$ cm$^{-3}$, or about $4\times10^{12}$ cm$^{-3}$ to about $4\times10^{18}$ cm$^{-3}$, or about $4\times10^{13}$ cm$^{-3}$ to about $4\times10^{17}$ cm$^{-3}$, although other concentrations are also contemplated, where the dopant concentration of the third nanosheet layer 150 can have double the dopant concentration of the second nanosheet layer 140 to provide about a 150 mV difference in the threshold voltages between the second nanosheet layer 140 and the third nanosheet layer 150.

In various embodiments, a fourth nanosheet layer 160 can have a dopant concentration in a range of about $8\times10^{11}$ cm$^{-3}$ to about $8\times10^{19}$ cm$^{-3}$, or about $8\times10^{12}$ cm$^{-3}$ to about $8\times10^{18}$ cm$^{-3}$, or about $8\times10^{13}$ cm$^{-3}$ to about $8\times10^{17}$ cm$^{-3}$, although other concentrations are also contemplated, where the dopant concentration of the fourth nanosheet layer 160 can have double the dopant concentration of the third nanosheet layer 150 to provide about a 150 mV difference in the threshold voltages between the third nanosheet layer 150 and the fourth nanosheet layer 160.

In various embodiments, greater or lesser dopant concentrations in each of the nanosheets layers 130, 140, 150, 160 can provide different threshold voltages, $V_T$, for the nanosheets layers, and greater or lesser changes in the dopant concentrations of different layers can vary the profile of the step function for the source-to-drain current. The differences in the dopant concentrations can control the voltage break-points for the current step function and the current profile, where larger differences in dopant concentrations can provide sharper current steps. In various embodiments, a current supply device can have a greater number of nanosheets with a smaller difference in threshold voltages to provide a smoother current-to-voltage response, whereas a bit encoding device can have fewer nanosheets with a greater difference in threshold voltages to provide distinct step changes. In various embodiments, a 150 mV difference in the threshold voltages between nanosheets may be the smallest change in the threshold voltages.

In one or more embodiments, the dopant(s) can be boron (B), aluminum (Al), phosphorus (P), arsenic (As), tin (Sn), silicon (Si), germanium (Ge), magnesium (Mg), or a combination thereof. In various embodiments, the dopant(s) can be boron (B), aluminum (Al), phosphorus (P), or arsenic (As), where the nanosheet layers 130 are silicon (Si) or silicon carbide (SiC). In various embodiments, the dopant(s) can be silicon (Si), germanium (Ge), tin (Sn), or magnesium (Mg), where the nanosheet layers 130 are III-V compound semiconductor materials.

In various embodiments, the substrate 110 can be a semiconductor substrate, where the semiconductor can be a type IV semiconductor (e.g., silicon (Si), germanium (Ge)), a IV-IV semiconductor (e.g., silicon-germanium (SiGe), silicon carbide (SiC), a III-V semiconductor (e.g., gallium arsenide (GaAs), indium phosphide (InP), indium-gallium arsenide (InGaAs), gallium nitride (GaN), etc.), where the crystal structure can allow epitaxial growth on a crystalline surface. In various embodiments, the substrate 110 can be a semiconductor-on-insulator substrate (SeOI).

In one or more embodiments, a device template layer 170 can be formed on the top sacrificial layer 120, where the device template layer 170 can be a hardmask formed by a blanket deposition, for example, chemical vapor deposition (CVD) or plasma enhanced CVD (PECVD).

In various embodiments, the device template layer 170 can be a hardmask material, including, but not limited to, silicon oxide (SiO), silicon nitride (SiN), silicon oxynitride (SiON), silicon borocarbonitride (SiBCN), and combinations thereof.

Figure 2:
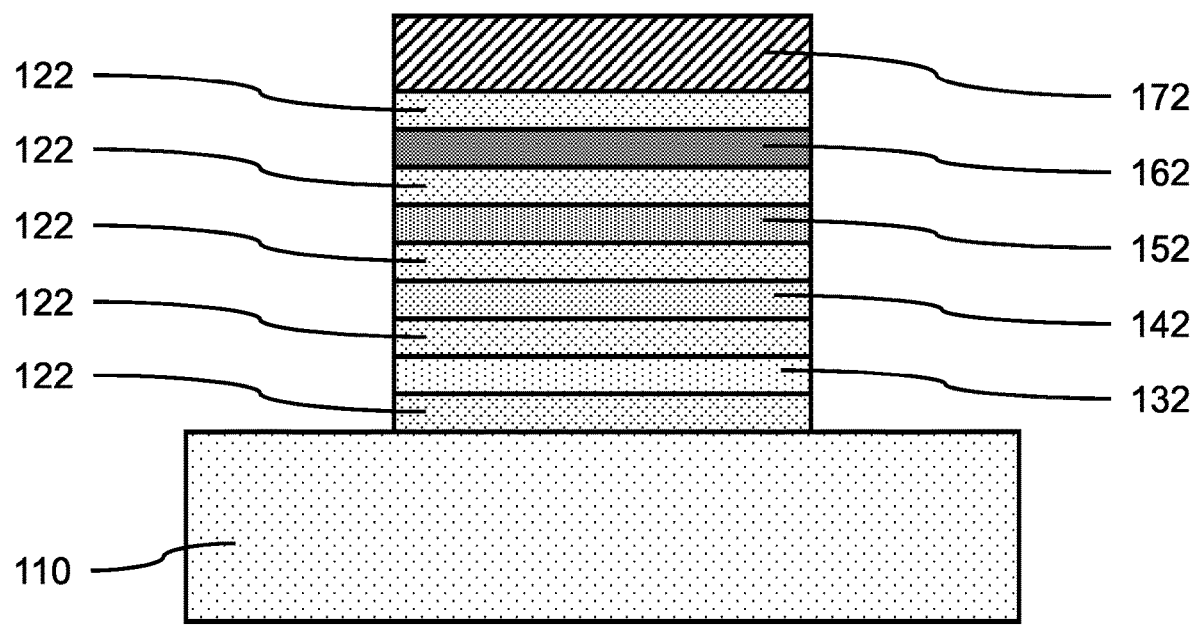
FIG. 2 is a cross-sectional side view showing the stack patterned into alternating sacrificial layer segments and nanosheet layer segments on a substrate with a nanosheet template on the stack, in accordance with an embodiment of the present invention.

FIG. 2 is a cross-sectional side view showing the stack patterned into alternating sacrificial layer segments and nanosheet layer segments on a substrate with a nanosheet template on the stack, in accordance with an embodiment of the present invention.

In one or more embodiments, the device template layer 170 can be patterned using lithographic processes and etching to form one or more device template(s) 172. The device templates 172 can have a predetermined length and width for masking the underlying layers to form sacrificial layer segments 122 and nanosheet layer segments 132, 142, 152, 162. In various embodiments, trenches can be formed through the sacrificial layers 120 and nanosheet layers using a selective, directional etch, for example, a reactive ion etch (RIE) to separate the stacked sacrificial layers 120 and nanosheet layers 130, 140, 150, 160 into stacked sacrificial layer segments 122 and nanosheet layer segments 132, 142, 152, 162 that can be adjacent to each other.

Figure 3:
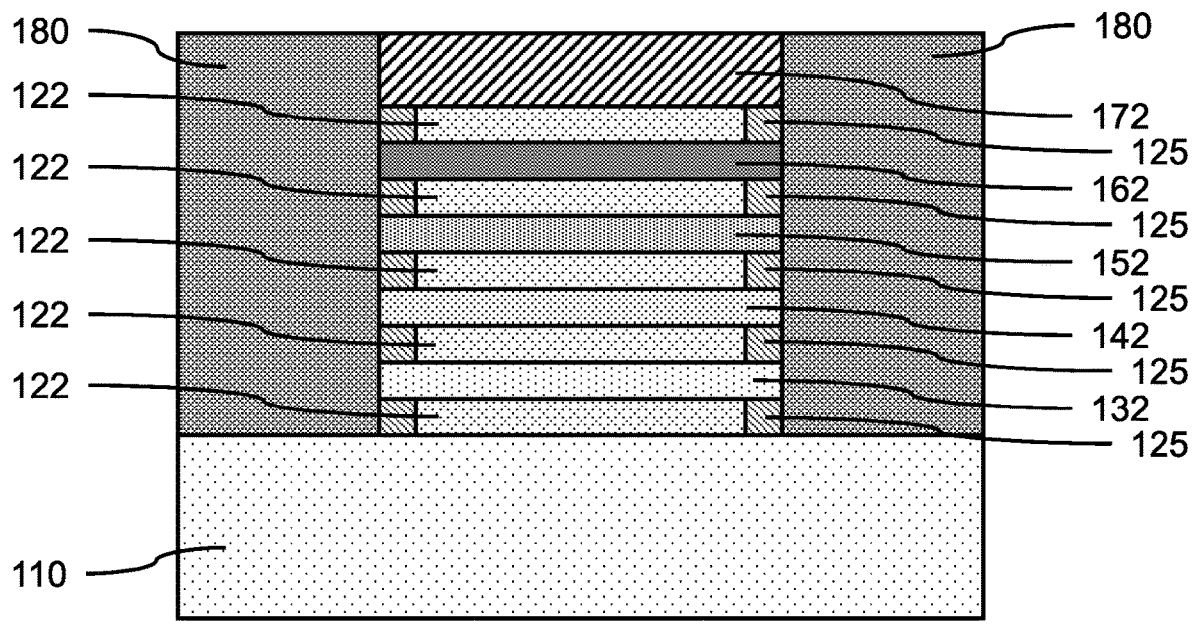
FIG. 3 is a cross-sectional side view showing inner liners formed in place of portions of the sacrificial layer segments, and source/drains formed on opposite sides of the patterned stack of nanosheets and sacrificial sheets, in accordance with an embodiment of the present invention.

FIG. 3 is a cross-sectional side view showing inner liners formed in place of portions of the sacrificial layer segments, and source/drains formed on opposite sides of the patterned stack of nanosheets and sacrificial sheets, in accordance with an embodiment of the present invention.

In one or more embodiments, portions of the sacrificial layer segments 122 can be removed using an isotropic etch (e.g., wet chemical etch) and replaced with inner liners 125, where the inner liners can be formed by a conformal deposition and an etch-back. In various embodiments, the inner liners 125 can be a dielectric material, including, but not limited to, silicon oxide (SiO), silicon nitride (SiN), silicon oxynitride (SiON), silicon borocarbonitride (SiBCN), aluminum oxide (AlO), hafnium oxide (HfO), and combinations thereof.

In one or more embodiments, source/drains 180 can be formed on the exposed surfaces of the substrate 110 and nanosheet layer segments 132, 142, 152, 162, where the source/drains 180 can be formed by epitaxial or heteroepitaxial growth on the exposed crystal faces of the substrate 110 and/or nanosheet layer segments 132, 142, 152, 162, where the epitaxial growth can depend on the exposes crystal faces of the substrate and nanosheet layer segments. In various embodiments, the source/drains 180 can be a semiconductor material, for example, silicon (Si), silicon-germanium (SiGe), silicon carbide (SiC), or III-V semiconductors (e.g., gallium arsenide (GaAs), indium phosphide (InP), indium-gallium arsenide (InGaAs), gallium nitride (GaN), etc.) doped with an n-type dopant (e.g., phosphorus (P), arsenic (As), etc.) or a p-type dopant (e.g., boron (B), gallium (Ga), etc.). In a non-limiting exemplary embodiment, the source/drains 180 can be phosphorus-doped silicon (Si:P) to form an n-type FET or a boron-doped silicon germanium (SiGe:B) to form a p-type FET.

In various embodiments, source/drains 180 can be on opposite ends of a stack of nanosheet layer segment(s) 132, 142, 152, 162, where the source/drains 180 are electrically connected to the nanosheet layer segment(s) and support the nanosheet layer segment(s) at least at the end walls. The nanosheet layer segments 132, 142, 152, 162 can form multiple device channels between the source/drains 180, where the different dopant concentrations can cause the different device channels to "turn on" at different threshold voltages, $V_T$, applied to a gate structure. By applying different voltages to the gate structure, current through the multiple device channels can be adjusted, where adjustment can be in a step-wise manner.

Figure 4:
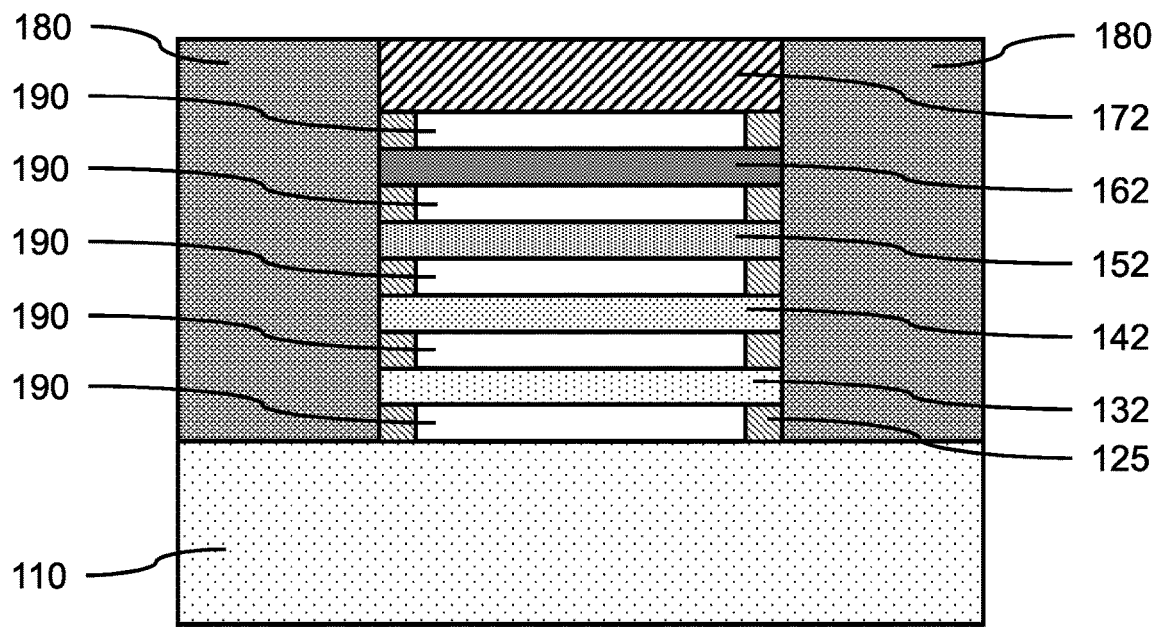
FIG. 4 is a cross-sectional side view showing the sacrificial layer segments removed from between the differentially doped nanosheet layer segments, and the nanosheet layer segments supported by the source/drains, in accordance with an embodiment of the present invention.

FIG. 4 is a cross-sectional side view showing the sacrificial layer segments removed from between the differentially doped nanosheet layer segments, and the nanosheet layer segments supported by the source/drains, in accordance with an embodiment of the present invention.

In one or more embodiments, the sacrificial layer segments 122 can be removed from between the nanosheet layer segments 132, 142, 152, 162 using an isotropic etch, for example, a wet chemical etch or a dry plasma etch. The removal of the sacrificial layer segments 122 can create cavities 190 between the nanosheet layer segments 132, 142, 152, 162 and inner liners 125.

Figure 5:
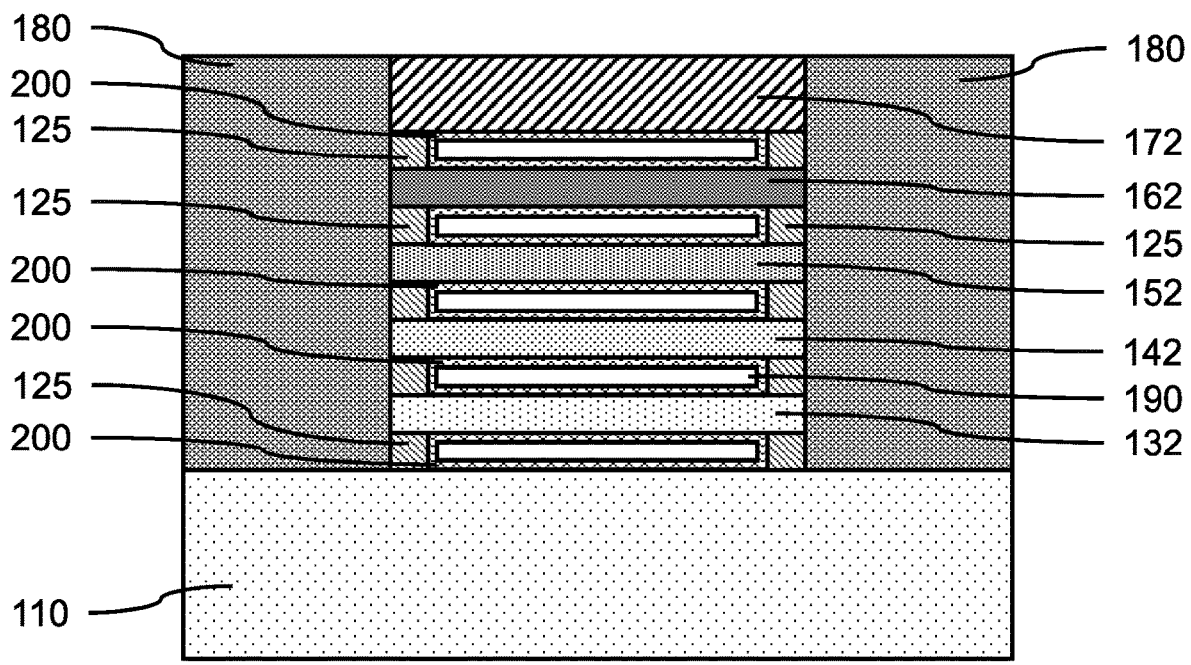
FIG. 5 is a cross-sectional side view showing a gate dielectric layer formed on the differentially doped nanosheet layer segments and inner liners, in accordance with an embodiment of the present invention.

FIG. 5 is a cross-sectional side view showing a gate dielectric layer formed on the differentially doped nanosheet layer segments and inner liners, in accordance with an embodiment of the present invention.

In one or more embodiments, a gate dielectric layer 200 can be formed around the nanosheet layer segments 132, 142, 152, 162 and on the exposed surfaces of the inner liners 125, device template 172, and substrate 110. The gate dielectric layer 200 can be formed by a conformal deposition, for example, atomic layer deposition (ALD), plasma enhanced ALD (PEALD), or combinations thereof. The gate dielectric layer 200 can be formed on the exposed surfaces of the nanosheet layer segments, as part of a gate structure, and on other exposed surfaces, for example, the substrate 110 and device template 172.

In one or more embodiments, the gate dielectric layer 200 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, the gate dielectric layer 200 can have a thickness in a range of about 1 nm to about 5 nm, or about 2 nm to about 3 nm, although other thicknesses are contemplated. The gate dielectric layer 200 on facing surfaces of adjacent nanosheet layer segments and/or device template(s) 172 can fill in a portion of the cavities 190, while leaving sufficient space between the adjacent layers to form a gate electrode.

Figure 6:
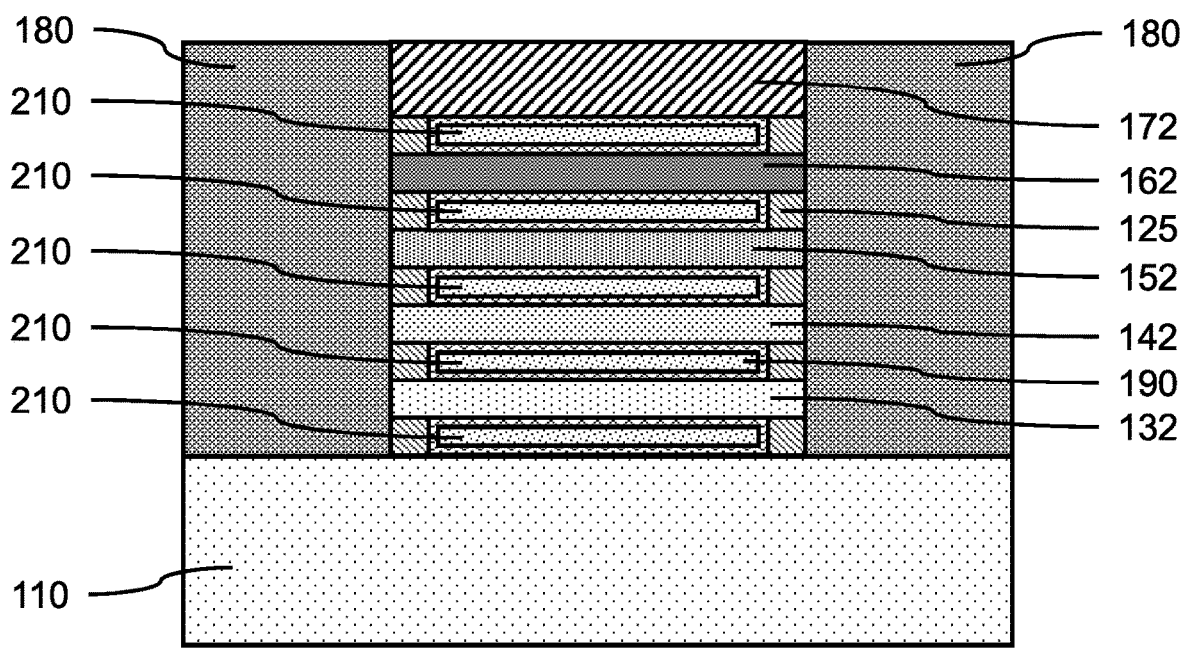
FIG. 6 is a cross-sectional side view showing a gate electrode formed on the gate dielectric layer between the differentially doped nanosheet layer segments and inner liners, in accordance with an embodiment of the present invention.

FIG. 6 is a cross-sectional side view showing a gate electrode formed on the gate dielectric layer between the differentially doped nanosheet layer segments and inner liners, in accordance with an embodiment of the present invention.

In one or more embodiments, a gate electrode 210 can be formed in the remaining space of the cavities 190 and on the gate dielectric layer 200, where the gate electrode 210 can be formed by a conformal deposition (e.g., ALD, PEALD). The gate dielectric layer 200 and gate electrode 210 can form a gate-all-around structure on the nanosheet layer segments 132, 142, 152, 162. The gate structure can also be formed on any additional nanosheet layer segments in addition to the four shown.

In one or more embodiments, the gate electrode 210 can be a conductive material, including, but not limited to, doped polycrystalline or amorphous silicon (pc-Si, a-Si), germanium (Ge), silicon-germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), tantalum magnesium carbide (TaMgC), carbon nanotubes (CNT), conductive carbon, graphene, or any suitable combination of these materials. The conductive gate electrode material may further include dopants that are incorporated during or after deposition.

In one or more embodiments, the multi-channel nanosheet device can function as a current source for a current-driven resistive processing unit (RPU) cell, where the current can be modulated by the gate voltage. The multi-channel nanosheet device can be scaled down with the RPU cell.

Figure 7:
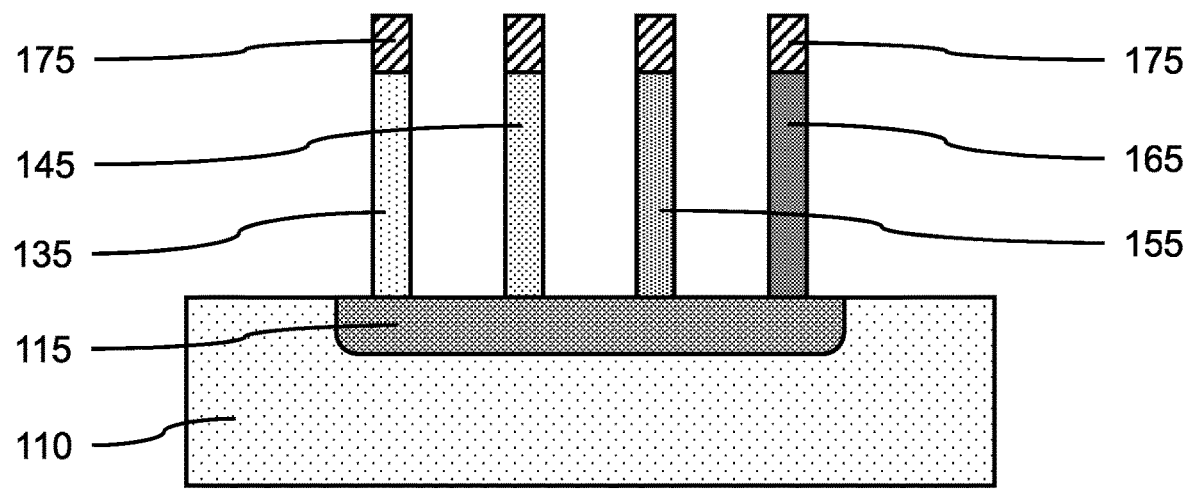
FIG. 7 is a cross-sectional side view showing a plurality of differentially doped vertical fins on a substrate with a fin template on each of the vertical fins, in accordance with another embodiment of the present invention.

FIG. 7 is a cross-sectional side view showing a plurality of differentially doped vertical fins on a substrate with a fin template on each of the vertical fins, in accordance with another embodiment of the present invention.

In one or more embodiments, a plurality of vertical fins can be formed on a substrate 110, where the vertical fins can be differentially doped. One or more vertical fins can be formed on a substrate 110, where the vertical fins can be formed by epitaxial growth and/or directional etching, for example, by reactive ion etching (RIE). In various embodiments, the vertical fins can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the vertical fins can be formed by a direct-write process, for example, using extreme ultraviolet (EUV) lithography, electron beam lithography, or x-ray lithography. In various embodiments, the vertical fins can be formed from the same semiconductor, and different amounts of dopant diffused into each of the different vertical fins through masking and control of dopant sources (e.g., gaseous, solid state, etc.) to form a plurality of differentially doped vertical fins 135, 145, 155, 165 on the substrate.

In various embodiments, a fin template 175 can be formed on each of the vertical fins 135, 145, 155, 165, where a fin template 175 can be formed on each of the vertical fins from a fin template layer as part of the patterning process. In various embodiments, the fin templates 175 can be a hardmask, for example, silicon oxide (SiO), silicon nitride (SiN), silicon oxynitride (SiON), silicon boronitride (SiBN), or a combination therefore.

In various embodiments, the differentially doped vertical fins 135, 145, 155, 165 can have a dopant concentration in a range of about $1 \times 10^{11}$ cm$^{-3}$ to about $1 \times 10^{19}$ cm$^{-3}$.

In various embodiments, a first doped vertical fin 135 can have a dopant concentration in a range of about $1 \times 10^{11}$ cm$^{-3}$ to about $1 \times 10^{19}$ cm$^{-3}$, or about $1 \times 10^{12}$ cm$^{-3}$ to about $1 \times 10^{18}$ cm$^{-3}$, or about $1 \times 10^{13}$ cm$^{-3}$ to about $1 \times 10^{17}$ cm$^{-3}$, although other concentrations are also contemplated.

In various embodiments, a second doped vertical fin 145 can have a dopant concentration in a range of about $2 \times 10^{11}$ cm$^{-3}$ to about $2 \times 10^{19}$ cm$^{-3}$, or about $2 \times 10^{12}$ cm$^{-3}$ to about $2 \times 10^{18}$ cm$^{-3}$, or about $2 \times 10^{13}$ cm$^{-3}$ to about $2 \times 10^{17}$ cm$^{-3}$, although other concentrations are also contemplated, where the dopant concentration of the second doped vertical fin 145 can have double the dopant concentration of the first doped vertical fin 135 to provide about a 150 mV difference in the threshold voltages between the first doped vertical fin 135 and the second doped vertical fin 145. In various embodiments, the differences in dopant concentrations between the doped vertical fins can be adjusted to obtain a predetermined change in the threshold voltages.

In various embodiments, a third doped vertical fin 155 can have a dopant concentration in a range of about $4 \times 10^{11}$ cm$^{-3}$ to about $4 \times 10^{19}$ cm$^{-3}$, or about $4 \times 10^{12}$ cm$^{-3}$ to about $4 \times 10^{18}$ cm$^{-3}$, or about $4 \times 10^{13}$ cm$^{-3}$ to about $4 \times 10^{17}$ cm$^{-3}$, although other concentrations are also contemplated, where the dopant concentration of the third doped vertical fin 155 can have double the dopant concentration of the second doped vertical fin 145 to provide about a 150 mV difference in the threshold voltages between the second doped vertical fin 145 and the third doped vertical fin 155.

In various embodiments, a fourth doped vertical fin 165 can have a dopant concentration in a range of about $8 \times 10^{11}$ cm$^{-3}$ to about $8 \times 10^{19}$ cm$^{-3}$, or about $8 \times 10^{12}$ cm$^{-3}$ to about $8 \times 10^{18}$ cm$^{-3}$, or about $8 \times 10^{13}$ cm$^{-3}$ to about $8 \times 10^{17}$ cm$^{-3}$, although other concentrations are also contemplated, where the dopant concentration of the fourth doped vertical fin 165 can have double the dopant concentration of the third doped vertical fin 155 to provide about a 150 mV difference in the threshold voltages between the third doped vertical fin 155 and the fourth doped vertical fin 165.

In various embodiments, greater or lesser dopant concentrations in each of the differentially doped vertical fins 135, 145, 155, 165 can provide different threshold voltages, $V_T$, for the doped vertical fins, and greater or lesser changes in the dopant concentrations of different vertical fins can vary the profile of the step function for the source-to-drain current. The differences in the dopant concentrations can control the voltage break-points for the current step function and the current profile, where larger differences in dopant concentrations can provide sharper current steps.

While the exemplary description has discussed four doped vertical fins with different dopant concentration, this is not intended to be limiting, and other numbers of doped vertical fins are contemplated. In various embodiments, the number of doped vertical fins having different dopant concentrations can be in a range of 2 to 50, or in a range of 3 to 25, or in a range of 4 to 15, or in a range of 5 to 12, although other numbers are also contemplated. The number of doped vertical fins having different dopant concentrations can control the number of steps in the device/current step function. Additional fins can have increasing or decreasing dopant concentrations.

In one or more embodiments, a bottom source/drain region 115 can be formed on the substrate 110, where the bottom source/drain region 115 can be formed by in-situ doped epitaxial growth, ion implantation, gas phase doping, plasma doping, plasma immersion ion implantation, cluster doping, infusion doping, liquid phase doping, solid phase doping, and/or any suitable combination of those techniques. In various embodiments, dopants can be activated by thermal annealing, such as laser annealing, flash annealing, rapid thermal annealing (RTA) or any suitable combination of those techniques. Dopants can be n-type, for example, phosphorus (P) or arsenic (As), or p-type, for example, boron (B), or gallium (Ga), where the dopants can form an n-type FET or a p-type FET.

Figure 8:
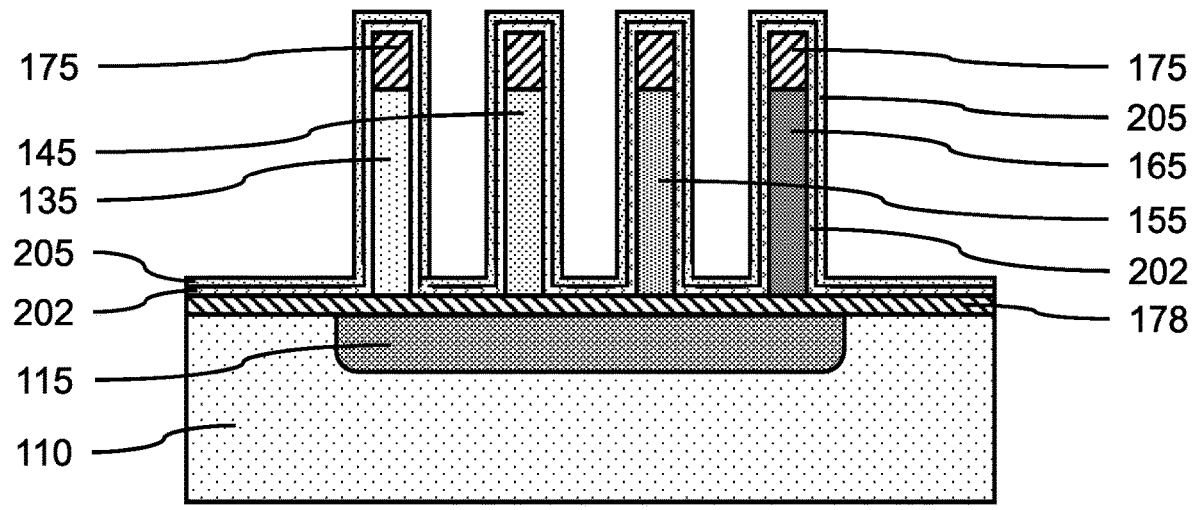
FIG. 8 is a cross-sectional side view showing a gate dielectric layer on the plurality of differentially doped vertical fins and fin templates, and a work function material layer on the gate dielectric layer, in accordance with another embodiment of the present invention.

FIG. 8 is a cross-sectional side view showing a gate dielectric layer on the plurality of differentially doped vertical fins and fin templates, and a work function material layer on the gate dielectric layer, in accordance with another embodiment of the present invention.

In one or more embodiments, a bottom spacer layer 178 can be formed on the exposed top surfaces of the bottom source/drain region 115 and substrate 110, where the bottom spacer layer 178 can be formed by a directional deposition, for example, a high density plasma (HDP) or gas cluster ion beam (GCIB) or a blanket deposition, for example, chemical vapor deposition (CVD) or plasma enhanced CVD (PECVD) and etch-back (e.g., RIE). An isotropic etch can be used to remove deposited material from the formation of the bottom spacer layer 178 from the sidewalls of the vertical fins.

In various embodiments, the bottom spacer layer 178 can be formed to a thickness in a range of about 4 nm to about 10 nm, or about 5 nm to about 7 nm, although other thicknesses are also contemplated. The bottom spacer layer 178 can cover a lower portion of the differentially doped vertical fins 135, 145, 155, 165.

In one or more embodiments, the bottom spacer layer 178 can be a dielectric material, including, but not limited to, silicon nitride (SiN), silicon oxynitride (SiON), silicon carbo-oxynitride (SiCON), and combinations thereof. The bottom spacer layer 178 can be the same or a different material from the fin templates 175 to provide etch selectivity.

In one or more embodiments, a gate dielectric layer 202 can be formed on the exposed surfaces of the bottom spacer layer 178, plurality of differentially doped vertical fins, and fin templates 175, where the gate dielectric layer 202 can be formed by a conformal deposition, for example, atomic layer deposition (ALD), plasma enhanced ALD (PEALD), low pressure chemical vapor deposition (LPCVD), or combinations thereof.

In various embodiments, the gate dielectric layer 202 can be formed to a thickness in a range of about 1 nm to about 5 nm, or about 2 nm to about 4 nm, although other thicknesses are also contemplated.

In various embodiments, the gate dielectric layer 202 can be silicon oxide (SiO), silicon nitride (SiN), a high-K dielectric material, or a combination thereof.

In one or more embodiments, a work function material layer 205 can be formed on the gate dielectric layer 202 by a conformal deposition (e.g., ALD, PEALD). The work function material layer 205 can be formed by a conformal deposition (e.g., ALD, PEALD). In various embodiments, multiple work function material layers 205 can be formed on the gate dielectric layer 202.

In various embodiments, the work function material layer 205 can have a thickness in a range of about 5 nanometers (nm) to about 200 nm, or about 7 nm to about 100 nm, although other thicknesses are also contemplated.

In various embodiments, the work function material layers 205 can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof.

Figure 9:
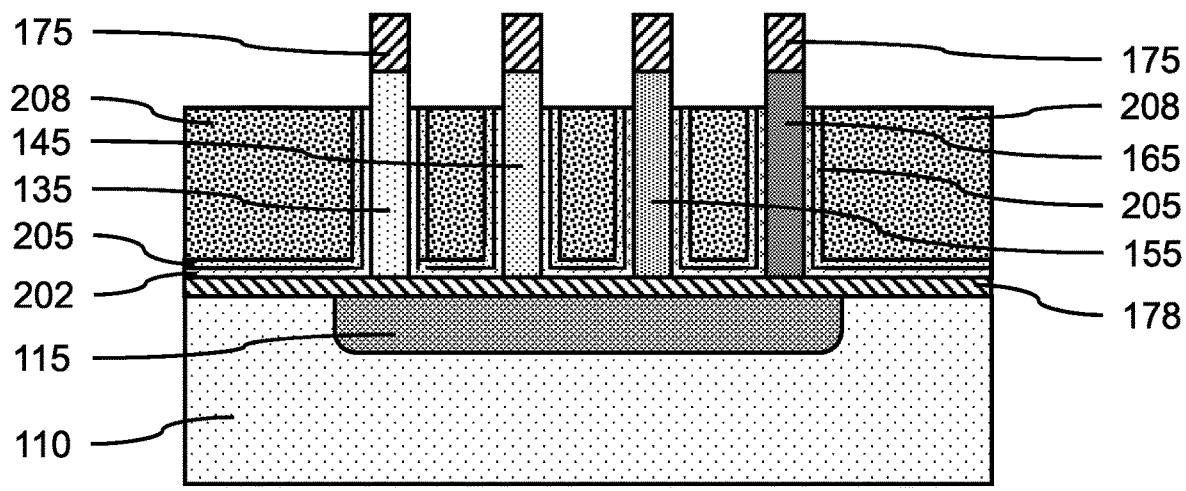
FIG. 9 is a cross-sectional side view showing a recessed conductive gate fill layer on the work function material layer, in accordance with another embodiment of the present invention.

FIG. 9 is a cross-sectional side view showing a recessed conductive gate fill layer on the work function material layer, in accordance with another embodiment of the present invention.

In one or more embodiments, a conductive gate fill layer 208 can be formed on the work function material layer 205, where the conductive gate fill layer 208 can be formed by a blanket deposition (e.g., CVD, PECVD). In various embodiments, the conductive gate fill layer 208 can be recessed using an etch-back process (e.g., RIE) to expose an upper portion of the differentially doped vertical fins 135, 145, 155, 165 below the fin templates 175. Portions of the gate dielectric layer 202 and work function material layer 205 exposed by recessing the conductive gate fill layer 208 can be subsequently removed.

In various embodiments, the gate fill layer can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), or combinations thereof.

The gate dielectric layer 202, the work function material layer 205, and conductive gate fill layer 208 can form a gate structure on the doped vertical fins, where the gate dielectric layer 202 and the work function material layer 205 can surround each of the vertical fins on four sides.

Figure 10:
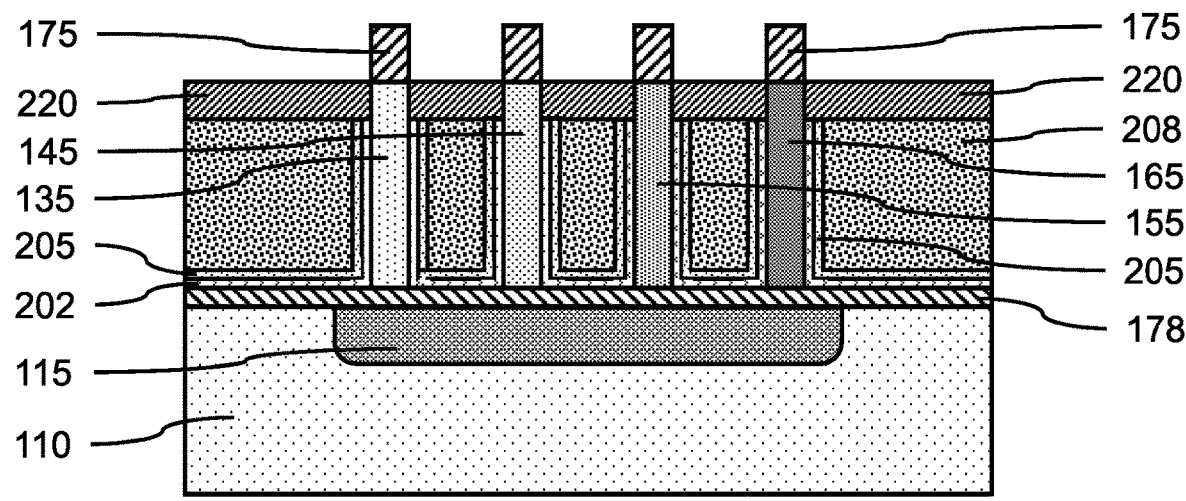
FIG. 10 is a cross-sectional side view showing a top spacer layer on the recessed conductive gate fill layer, work function material layer, and gate dielectric layer, in accordance with another embodiment of the present invention.

FIG. 10 is a cross-sectional side view showing a top spacer layer on the recessed conductive gate fill layer, work function material layer, and gate dielectric layer, in accordance with another embodiment of the present invention.

In one or more embodiments, a top spacer 220 can be formed in the space left be etching back the conductive gate fill layer 208, work function material layer 205, and gate dielectric layer 202. The top spacer 220 can be formed by a deposition and etch-back. In various embodiments, the top spacers 220 can be a dielectric material, including, but not limited to, silicon nitride (SiN), silicon oxynitride (SiON), silicon carbo-oxynitride (SiCON), and combinations thereof. The top spacer 220 can be the same material as the bottom spacer layer 178, but different from the top spacer 220 to allow selective removal.

Figure 11:
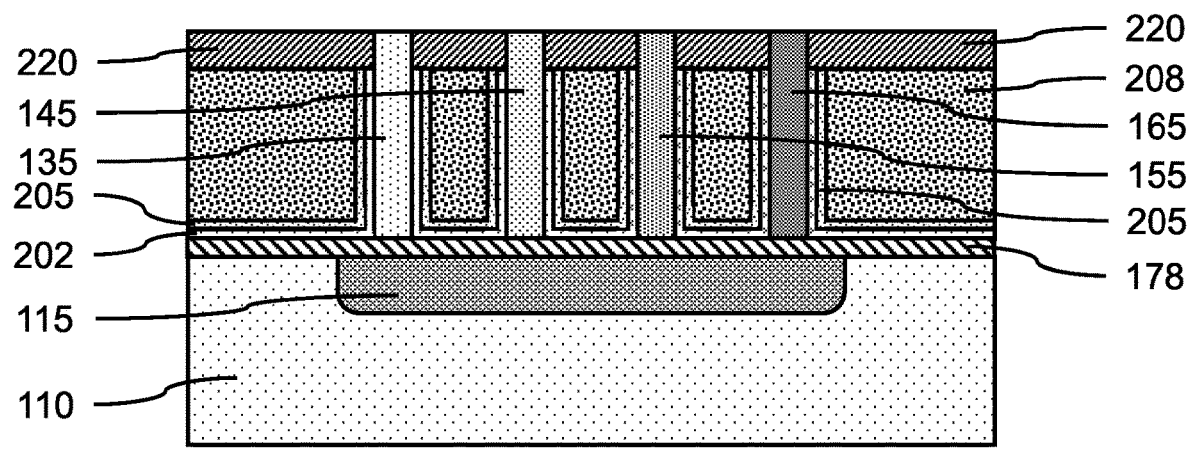
FIG. 11 is a cross-sectional side view showing the fin templates removed from the plurality of differentially doped vertical fins, in accordance with another embodiment of the present invention.

FIG. 11 is a cross-sectional side view showing the fin templates removed from the plurality of differentially doped vertical fins, in accordance with another embodiment of the present invention.

In one or more embodiments, the fin templates 175 can be removed from the plurality of differentially doped vertical fins 135, 145, 155, 165 to expose the top surfaces of the vertical fins. The fin templates 175 can be removed using a selective isotropic etch (e.g., wet chemical etch).

Figure 12:
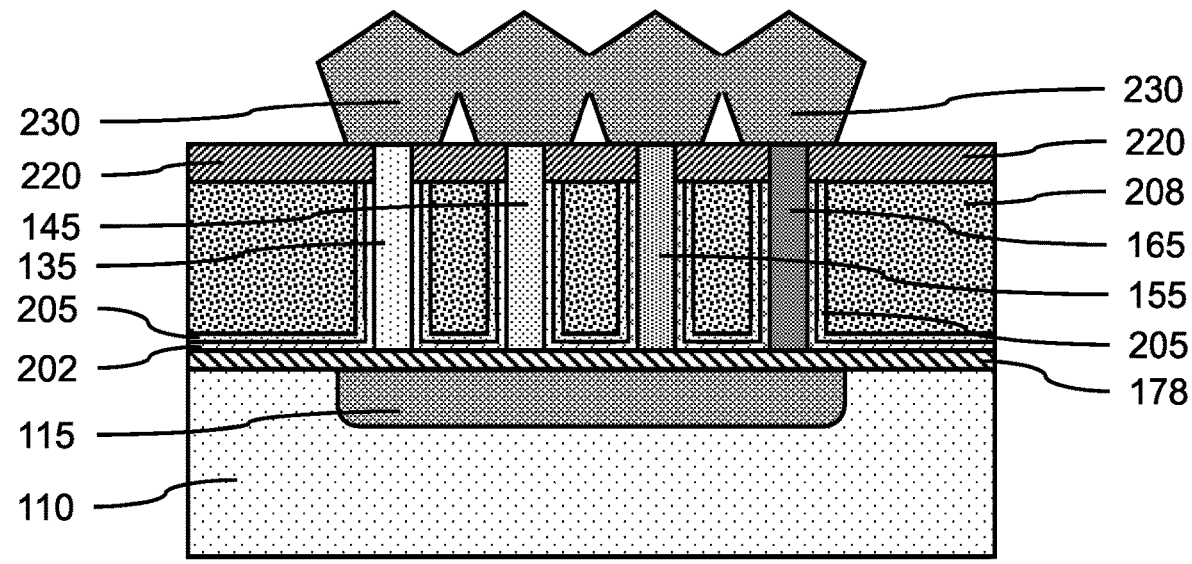
FIG. 12 is a cross-sectional side view showing a merged top source/drain formed on the plurality of differentially doped vertical fins, in accordance with another embodiment of the present invention.

FIG. 12 is a cross-sectional side view showing a merged top source/drain formed on the plurality of differentially doped vertical fins, in accordance with another embodiment of the present invention.

In one or more embodiments, a top source/drain 230 can be formed on each of the differentially doped vertical fins 135, 145, 155, 165, where the top source/drains 230 can be formed by epitaxial growth on the exposed top surfaces of the vertical fins. The epitaxial growth can be continued until the top source/drains 230 merge into a single top source/drain, such that current can travel between the bottom source/drain region 115 and the top source/drain 230 through any of the differentially doped vertical fins 135, 145, 155, 165 acting as the device channels.

In various embodiments, the nanosheet devices or vertical fin devices can provide multiple states based on the gate voltage applied, where the different states can provide multi-valued logic, not just binary "1" and "0". The number of differentially doped vertical fins 135, 145, 155, 165 or nanosheet layer segments 132, 142, 152, 162 can determine the number of logic bits that can be transmitted or stored by a single device.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of devices and methods of fabricating the devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a multi-state nanosheet transistor device, comprising:

forming an alternating sequence of sacrificial layer segments and differentially doped nanosheet layer segments on a substrate, wherein each of the differentially doped nanosheet layer segments has a different dopant concentration from the other differentially doped nanosheet layer segments;

forming a source/drain on each of opposite ends of the sacrificial layer segments and differentially doped nanosheet layer segments;

removing the sacrificial layer segments;

depositing a gate dielectric layer on the differentially doped nanosheet layer segments; and forming a gate electrode on the gate dielectric layer to form a common gate-all-around structure, where each of the differentially doped nanosheet layer segments conducts current at a different threshold voltage.

2. The method of claim 1, wherein the differentially doped nanosheet layer segments each have a dopant concentration in a range of about $1\times10^{11}$ cm$^{-3}$ to about $1\times10^{19}$ cm$^{-3}$.

3. The method of claim 1, wherein the alternating sequence of sacrificial layer segments and differentially doped nanosheet layer segments includes at least four differentially doped nanosheet layer segments, which includes a second differentially doped nanosheet layer segment that has about double the dopant concentration of a first differentially doped nanosheet layer segment of the at least four differentially doped nanosheet layer segments.

4. The method of claim 3, wherein the first differentially doped nanosheet layer segment has a dopant concentration of about $1\times10^{12}$ cm' to about $1\times10^{18}$ cm$^{-3}$, and the second differentially doped nanosheet layer segment has a dopant concentration of about $2\times10^{12}$ cm$^3$ to about $2\times10^{18}$ cm$^{-3}$.

5. The method of claim 4, wherein a third differentially doped nanosheet layer segment of the at least four differentially doped nanosheet layer segments has a dopant concentration of about $4\times10^{12}$ cm$^{-3}$ to about $4\times10^{18}$ cm$^{-3}$.

6. The method of claim 5, wherein a fourth differentially doped nanosheet layer segment of the at least four differentially doped nanosheet layer segments has a dopant concentration of about $8\times10^{12}$ cm$^{-3}$ to about $8\times10^{18}$ cm$^{-3}$.

7. The method of claim 6, wherein the dopant concentrations of the at least four differentially doped nanosheet layer segments provide an integer multiple of about a 150 mV difference in the threshold voltages between each vertically adjacent pair of the at least four differentially doped nanosheet layer segments.

* * * * *